(12) United States Patent  
Nakayama

(10) Patent No.: US 6,853,086 B1  
(45) Date of Patent: Feb. 8, 2005

(54) SEMICONDUCTOR DEVICE AND METHOD OF MANUFACTURE THEREOF, CIRCUIT BOARD, AND ELECTRONIC INSTRUMENT

(75) Inventor: Toshiyuki Nakayama, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/582,351

(22) PCT Filed: Oct. 28, 1999

(86) PCT No.: PCT/JP99/05967

§ 371 (c)(1),
(2), (4) Date: Aug. 11, 2000

(87) PCT Pub. No.: WO00/26959

PCT Pub. Date: May 11, 2000

(30) Foreign Application Priority Data

Oct. 30, 1998 (JP) .......................................... 10-326184

(51) Int. Cl.$^7$ .......................... H01L 23/48; H01L 23/52; H01L 29/40
(52) U.S. Cl. ..................... 257/778; 257/666; 257/676; 257/678; 257/684; 257/688; 257/690; 257/783; 361/777; 361/779; 361/783; 438/106; 438/107; 438/108; 438/118; 438/119; 174/250; 174/256; 174/257; 174/259
(58) Field of Search ............................... 257/666, 675, 257/676, 778, 786, 678, 684, 688, 690, 692, 711, 731–733, 737, 738, 767, 779, 782, 783, 795; 438/106–108, 118, 119; 361/777, 779, 783; 174/250, 256, 257, 259, 260; 29/832, 840; 228/180.22

(56) References Cited

U.S. PATENT DOCUMENTS 4,258,381 A * 3/1981 Inaba .......................... 257/666
5,519,576 A * 5/1996 Moore ......................... 361/723
5,548,890 A * 8/1996 Tada et al. ...................... 29/827
5,677,575 A * 10/1997 Maeta et al. .................. 257/778
5,731,631 A * 3/1998 Yama et al. ................. 257/702
5,767,009 A * 6/1998 Yoshida et al. ............. 438/613
5,783,867 A    7/1998 Belke, Jr. et al. ............ 257/783
5,798,571 A * 8/1998 Nakajima .................... 257/784
5,804,882 A    9/1998 Tsukagoshi et al. ......... 257/783
5,834,691 A * 11/1998 Aoki .......................... 174/52.4
5,869,886 A * 2/1999 Tokuno ....................... 257/678
5,969,461 A * 10/1999 Anderson et al. ........ 310/313 R
6,075,279 A * 6/2000 Andoh ......................... 257/620
6,175,151 B1 * 1/2001 Hashimoto ................... 257/676
6,208,021 B1 * 3/2001 Ohuchi et al. ............. 257/690
6,316,822 B1 * 11/2001 Venkateshwaran et al. . 257/666
6,700,187 B2 * 3/2004 Paek ........................... 257/673
6,724,084 B1 * 4/2004 Hikita et al. ................ 257/737

FOREIGN PATENT DOCUMENTS

| JP | A-4-317347 |   | 11/1992 |
| JP | A-6-97208 |   | 4/1994 |
| JP | 07169795 A | * | 7/1995 |
| JP | A-10-112475 |   | 4/1998 |
| JP | 10-92875 |   | 10/1998 |

* cited by examiner

Primary Examiner—George Eckert
Assistant Examiner—Chris Chu
(74) Attorney, Agent, or Firm—Oliff & Berridge, PLC

(57) ABSTRACT

A method of manufacture of a semiconductor device comprises a step of providing an adhesive (30) between a semiconductor chip (20) and a substrate (10), a step of positioning electrodes (22) and leads (12) to oppose each other, and a step of applying pressure in the direction of making the gap between the semiconductor chip (20) and substrate (10) narrower, and on the substrate (10), in a region opposing the surface of the semiconductor chip (20) and avoiding the leads (12), a film (14) is formed with lower adhesion with the adhesive (30) than the substrate (10).

20 Claims, 7 Drawing Sheets

SEMICONDUCTOR DEVICE AND METHOD OF MANUFACTURE THEREOF, CIRCUIT BOARD, AND ELECTRONIC INSTRUMENT

TECHNICAL FIELD

The present invention relates to a semiconductor device and method of manufacture thereof, to a circuit board, and to an electronic instrument.

BACKGROUND ART

The method of using an anisotropic conductive film for electrical connection between substrates is well known. Japanese Patent Application Laid-Open No. 4-317347 describes the bonding of a semiconductor chip and substrate in which this method is applied to flip-chip bonding.

A resin-based adhesive such as an anisotropic conductive film has high adhesion with the substrate, and therefore the adhesive itself has poor flowability, as a result of which holes and voids tend to form in and around the position of mounting an IC. Holes and voids act as gathering places for moisture, and thus have an adverse effect on reliability.

The present invention solves this problem, and has as its objective the provision of a semiconductor device and method of manufacture thereof, a circuit board, and an electronic instrument, such that holes and voids do not occur in and around the position of mounting an IC.

DISCLOSURE OF THE INVENTION (1) The method of manufacture of a semiconductor device of the present invention comprises the steps of:

providing an adhesive between a surface of a semiconductor chip having a plurality of electrodes on which the electrodes are provided and a surface of a substrate having a plurality of leads formed on which the leads are formed;

positioning at least one of the plurality of electrodes to oppose at least one of the plurality of leads; and applying pressure in a direction such as to make the gap between the semiconductor chip and the substrate narrower;

wherein on the surface of the substrate on which the leads are formed, in a region being at least part of a region of adherence of the semiconductor chip, a film is formed with a lower adhesion to the adhesive than a base material of the substrate.

According to the present invention, since the semiconductor chip and substrate are adhered by the adhesive, bonding of the two is achieved simply, and moreover, a strong fixing of the two (semiconductor chip and substrate) is possible to ensure the electrical connection of the electrodes and leads. On the substrate, in a region including at least a part of the region to which the semiconductor chip is adhered, a film is formed which has a lower adhesion with the adhesive than the base material of the substrate. Therefore, on this film surface, holes and voids become more easily dispersed, and are reduced in size to a tolerable level, whereby a semiconductor device of high reliability can be manufactured.

(2) In this method of manufacture of a semiconductor device, the adhesive may be formed of an anisotropic conductive material having conductive particles dispersed in an insulating material.

By means of this, the electrodes and leads can be electrically connected by the conductive particles, and the electrical connection can be carried out simultaneously with (that is, in the same operation as) the adhesion of the semiconductor chip and the substrate.

(3) In this method of manufacture of a semiconductor device, the leads and the film may be formed by etching a conductive foil adhered to the base material of the substrate.

By doing this, the leads and film can be formed simply in a small number of steps.

(4) In this method of manufacture, a conductive foil used when forming the leads may also be used to form the film.

(5) In this method of manufacture of a semiconductor device, the film may be formed simultaneously with the leads.

(6) In this method of manufacture of a semiconductor device, the electrodes may be provided on an extremity of the surface of the semiconductor chip, and the film may be formed in a region opposing a central part of the surface of the semiconductor chip.

By means of this, since the film with a low adhesion with the adhesive is formed in the central part in which holes and voids tend to form, a large benefit is obtained.

(7) In this method of manufacture of a semiconductor device, the film may be formed to spread two-dimensionally, with at least one opening exposing a surface of the substrate.

By doing this, since the surface of the substrate is exposed in the opening, in this portion the adhesion of the adhesive is increased, and the adhesive force between the semiconductor chip and the substrate is increased.

(8) In this method of manufacture of a semiconductor device, the film may be formed to project outside a region in which the semiconductor chip is adhered.

By doing this, holes and voids can easily escape to the exterior by passing over the portion of the film projecting outside the semiconductor chip.

(9) In this method of manufacture of a semiconductor device, the film may be formed to be symmetrical about a center point of the region in which the semiconductor chip is adhered.

By means of this, an adhesion force symmetrical with respect to the semiconductor chip can be applied. Here by the term "symmetrical adhesion force" is meant a balanced state, or a state with no unevenness.

(10) In this method of manufacture of a semiconductor device, the film may be formed to avoid at least one of the leads.

(11) In this method of manufacture of a semiconductor device, a part of the film may be formed in a position overlying the electrodes.

Then the film and electrodes may be electrically bonded.

(12) A semiconductor device of the present invention comprises:

a semiconductor chip having a plurality of electrodes;

a substrate on which is formed a plurality of leads; and an adhesive provided between a surface of the semiconductor chip on which the electrodes are formed and a surface of the substrate on which the leads are formed, and adhering the semiconductor chip and the substrate, wherein at least one of the plurality of electrodes and at least one of the plurality of leads are electrically connected; and wherein on the substrate in a region including at least a part of the region opposing the semiconductor chip, a film is formed with a lower adhesion to the adhesive than a base material of the substrate.

According to the present invention, the semiconductor chip and substrate are adhered by the adhesive, and the electrical connection between the electrodes and leads is achieved. On the substrate, in a region including at least a part of the region opposing the semiconductor chip, a film is formed, having a lower adhesion with the adhesive than the base material of the substrate. Therefore, on this film surface, holes and voids become more easily dispersed, and are reduced in size to a tolerable level, whereby the reliability is increased.

(13) In this semiconductor device, the adhesive may be formed of an anisotropic conductive material having conductive particles dispersed in an insulating material.

By means of this, the electrodes and leads can be electrically connected by the conductive particles, and the electrical connection can be achieved with the adhesion of the semiconductor chip and the substrate.

(14) In this semiconductor device, the leads and the film may be formed of the same electrically conductive material.

By doing this, the leads and film can be formed simply in a small number of steps.

(15) In this semiconductor device, the electrodes may be provided at an extremity of the surface of the semiconductor chip, and the film may be formed in a region opposing a central part of the surface of the semiconductor chip.

By means of this, since the film with a low adhesion with the adhesive is formed in the central part in which holes and voids tend to form, a large benefit is obtained.

(16) In this semiconductor device, the film may be formed to spread two-dimensionally, with at least one opening exposing a surface of the substrate.

By doing this, since the surface of the substrate is exposed in the opening, in this portion the adhesion of the adhesive is increased, and the adhesive force between the semiconductor chip and the substrate is increased.

(17) In this semiconductor device, the film may be formed to project outside a region in which the semiconductor chip is adhered.

By doing this, holes and voids can easily escape to the exterior by passing over the portion of the film projecting outside the semiconductor chip.

(18) In this semiconductor device, the film may be formed to be symmetrical about a center point of a region in which the semiconductor chip is adhered.

By means of this, an adhesion force symmetrical with respect to the semiconductor chip can be applied.

(19) In this semiconductor device, the film may be formed to avoid at least one of the leads.

(20) In this semiconductor device, a part of the film may be formed in a position overlying the electrodes.

Then the film and electrodes may be bonded.

(21) on a circuit board of the present invention, the above semiconductor device is mounted.

(22) An electronic instrument of the present invention has the above semiconductor device.

BEST MODE FOR CARRYING OUT THE INVENTION

The present invention is now described in terms of a number of preferred embodiments, with reference to the drawings, but the present invention is not restricted to these embodiments.

First Embodiment

Figure 1:
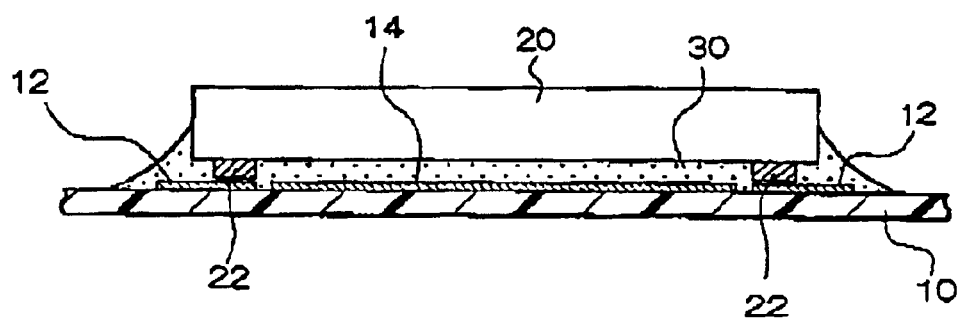
FIG. 1 shows a first embodiment of the semiconductor device according to the present invention.
Figure 2:
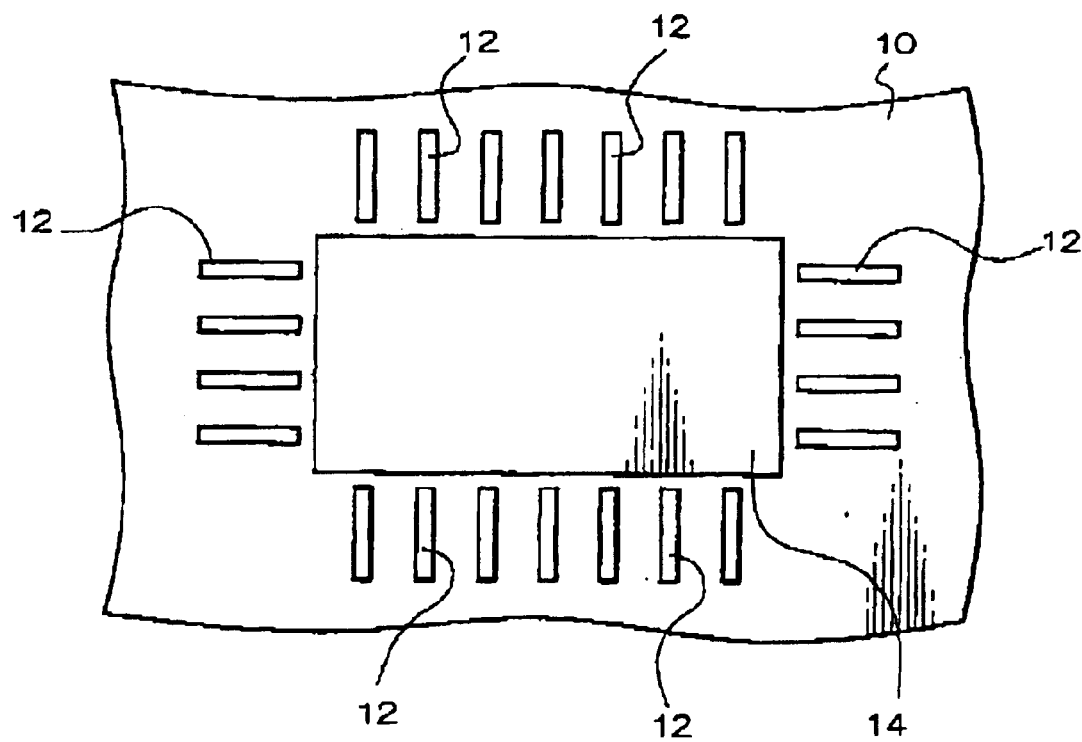
FIG. 2 shows the substrate of the first embodiment of the semiconductor device according to the present invention.

FIG. 1 shows a first embodiment of the semiconductor device to which the present invention is applied, and FIG. 2 shows the substrate used in the semiconductor device shown in FIG. 1. This embodiment of the semiconductor device includes a substrate 10, a semiconductor chip 20, and an adhesive 30. The substrate 10 includes a base material, an interconnect pattern formed on the base material, and a film 14 described hereinbelow.

In FIGS. 1 and 2, a part of the substrate 10 is shown cut away, and the overall shape thereof is not particularly restricted, and may be rectangular, polygonal, or a combination of a number of rectangles. The thickness of the base material of the substrate 10 is commonly determined by the material thereof, but this is also not restricted. The base material of the substrate 10 may be an organic or inorganic material, or may equally be a composite of the two. As a base material of the substrate 10 formed of an organic material may be cited, for example, a flexible substrate formed of a polyimide resin. As a base material of the substrate 10 formed of an inorganic material may be cited, for example, a ceramic substrate or glass substrate. As a composite construction of organic and inorganic materials may be cited, for example, a glass epoxy substrate.

On the base material of the substrate 10 is formed an interconnect pattern including a plurality of leads 12. On a part of the leads 12 (for example, an end part), if necessary, may be formed lands being wider than the leads 12, for the purpose of bonding the semiconductor chip 20 with electrodes 22. The spacing between adjacent leads 12 is preferably at least 30 µm. The leads 12 may be formed at a pitch of about 70 µm. It should be noted that in FIG. 2, only those of the leads 12 connected to the electrodes 22 of the semiconductor chip 20 or close to the position thereof are shown, but these leads 12 may be further extended and used as interconnects for external connection, or may be connected to electronic components.

The leads 12 are formed on one surface of the base material of the substrate 10, so as to avoid a part (for example, a central part). For example, a plurality of leads 12 are formed to surround a partial region (the rectangular region in the example shown in FIG. 2) of the base material of the substrate 10. In this case, the leads 12 may be formed at the extremity of the base material of the substrate 10, and leads 12 not formed in the central part. Of the plurality of leads 12, a group of leads 12 may be formed parallel facing in a single direction. The plurality of leads 12 may be arranged to be parallel aligned in respective of a plurality of directions. In this case, the plurality of leads 12 are divided into a plurality of groups of leads 12 aligned in a plurality of directions. It should be noted that the leads 12, in addition to being formed on one surface of the base material of the substrate 10, may also be formed on the other surface.

The leads 12 are formed of an electrically conductive material. As an electrically conductive material may be cited a metal. For example, the leads 12 can be formed by plating the surface of copper with gold or tin. Alternatively, the leads 12 may be formed of gold.

In the present invention, a three-layer substrate may be used, in which the leads 12 are attached to the base material of the substrate 10 with an interposed adhesive. Alternatively, the leads 12 can be formed by forming an electrically conductive film of copper or the like on the substrate by sputtering or the like, and then etching this. In this case, the leads 12 are directly formed on the base material of the substrate 10, in a two-layer substrate with no interposed adhesive. Or an additive method can be applied in which the leads 12 are formed by plating. Alternatively, a built-up substrate of multilayer construction can be used, in which an interconnect pattern is laminated to include an insulating resin and the leads 12, or a multilayer substrate in which a plurality of substrates are laminated.

On the surface of the base material of the substrate 10, the film 14 is formed. The film 14 preferably has lower adhesion with the adhesive 30 than with the surface of the base material of the substrate 10. The film 14 is formed to avoid at least one or all of the leads 12. The film 14 is formed so as not to contact at least one or all of the leads 12. Of the plurality of leads 12, not all but at least one may contact the film 14. For example, by contacting leads 12 to be connected to ground potential (GND potential) with the film 14 so as to be electrically conductive, the whole of the film 14 may be at ground potential (GND potential). In this case, since the film 14 which is larger than the leads 12 is at ground potential (GND potential), sudden variations in the potential thereof can be absorbed. Also, the potential of the semiconductor chip 20 itself is stabilized.

When the leads 12 are formed to avoid a part (for example the central part) of the surface of the base material of the substrate 10, in the portion avoided by the leads 12 (for example the central part), the film 14 can be formed. The form of the film 14 may be any of a rectangle, a polygon, or a combination of a plurality of rectangles.

The film 14 is formed in a region opposing the surface of the semiconductor chip 20 on which the electrodes 22 are formed. The film 14 is formed in a region including at least a part of the region contacted by the semiconductor chip 20. In more detail, the film 14 in its entirety, a part thereof, or at least a part thereof, and the surface of the semiconductor chip 20 on which the electrodes 22 are formed overlap in plan view. For example, the film 14 may be formed within the limits of the surface of the semiconductor chip 20 on which the electrodes 22 are formed (within the projection region of the surface on which the electrodes 22 are formed), and a part of the film 14 may project outside that region. If it is projecting, bubbles forming within the adhesive 30 are easily dispersed on the film 14 and released to the exterior.

The film 14 may be formed in such a shape as to avoid the electrodes 22 of the semiconductor chip 20. Alternatively, it may be formed to overlap a group of the plurality of electrodes 22 (being at least one and excluding the case of the totality) and make contact. In this case, since the film 14 has a larger area than the leads 12, the relative positioning of the electrodes 22 and film 14 is easy.

In the example shown in FIG. 2, the film 14 is formed within a region (for example a rectangular region) surrounded by the plurality of leads 12. The film 14 is formed in a position including the center point of the region of adhesion of the semiconductor chip 20. In particular, seen from this center point, the film 14 is preferably formed in a form with symmetry (point symmetry or line symmetry about a line through the point). By this means, a symmetrical adhesion force is applied to the semiconductor chip 20. The outer periphery of the film 14 and the edge of the leads 12 are preferably formed so as to leave as large a gap as possible, and are preferably formed to leave a gap of at least about 25 $\mu$m to 50 $\mu$m, and if there is leeway, more.

The film 14 can be made of an electrically conductive material. As an electrically conductive material may be cited a metal. For example, the film 14 can be formed with gold or tin plating over the whole surface of copper. Alternatively, the film 14 can be formed of gold. The metal commonly has a lower adhesion with the adhesive 30 than the surface of the base material of the substrate 10.

On the above described substrate 10 the semiconductor chip 20 is mounted. On the semiconductor chip 20 are formed the plurality of electrodes 22. These electrodes 22 preferably have conductive projections (bumps) formed. The semiconductor chip 20 has the surface on which the electrodes 22 are formed positioned opposing the surface of the base material of the substrate 10 on which the leads 12 and film 14 are formed. At least one of the electrodes 22 is positioned on a part of one of the leads 12. If a land is formed on the lead 12, the electrode 22 is positioned on the land. The region of the surface of the semiconductor chip 20 on which the electrodes 22 are formed excluding the electrodes 22 opposes all, a part, or at least a part of the film 14. Of the electrodes 22, at least one not being all may be positioned on the film 14.

The substrate 10 and semiconductor chip 20 are adhered with the adhesive 30. The adhesive 30 may have epoxy resin as its main constituent. The adhesive 30 may be insulating. Alternatively, the adhesive 30 may be an anisotropic conductive adhesive (ACA) containing dispersed conductive particles, such as an anisotropic conductive film (ACF) or anisotropic conductive paste (ACP). In that case, between the leads 12 formed on the base material of the substrate 10 and the electrodes 22 formed on the semiconductor chip 20, the conductive particles intervene, and provide an electrical connection between the two. Alternatively, the leads 12 and electrodes 22 may be directly bonded, and the substrate 10 and semiconductor chip 20 may be adhered with the adhesive 30. The surface of the semiconductor chip 20 on which the electrodes 22 are formed opposes the film 14. In this case, conductive projections are preferably formed on at least either of the electrodes 22 and the leads 12.

The adhesive 30 used here has a lower adhesion with the film 14 than with the base material of the substrate 10. Therefore, since the adhesive 30 has a high adhesion with the region of the base material of the substrate 10 in which the leads 12 and film 14 are not formed, it forms a strong bond between the substrate 10 and the semiconductor chip 20. Since the adhesive 30 adheres to the leads 12 and film 14 with a low adhesive force, for reasons such as that the flowability is increased, voids and holes tend not to form on the surface of the leads 12 and film 14. As a result, the accumulation of moisture in voids and holes can be prevented, and the reliability can be increased.

This embodiment is constructed as described above, and the method of manufacture thereof is now described. First, on the base material of the substrate 10, the leads 12 and film 14 are formed. The leads 12 and film 14 can be formed in separate processes, but are preferably formed in the same process. For example, a conductive foil such as a metal foil can be formed on the base material of the substrate 10, and this can be etched to form the leads 12 and film 14 together.

The adhesive 30 is provided on at least either of the surface of the semiconductor chip 20 on which the electrodes 22 are provided and the surface of the base material of the substrate 10 on which the leads 12 and film 14 are formed. The adhesive 30 may be previously provided in a form of an adhesive tape. As the adhesive 30 can be used an anisotropic conductive material or anisotropic conductive film.

Next, the surface of the semiconductor chip 20 on which the electrodes 22 are provided and the surface of the base material of the substrate 10 on which the leads 12 and film 14 are formed are opposed. Then of the plurality of electrodes 22 at least one or the totality, and of the plurality of leads 12 at least one or the totality are positioned. Furthermore, pressure is applied in the direction of making the gap between the semiconductor chip 20 and the substrate 10 narrower. When as the adhesive 30 is used an anisotropic conductive material having conductive particles within a resin, such as for example a solid anisotropic conductive film, then the conductive particles are squashed between the electrodes 22 and the leads 12, and pressure is applied until there is an electrical connection therebetween. This is fixed so that the two (the electrodes 22 and the leads 12) are in an electrically conductive state.

By means of the above process, a semiconductor device can be manufactured. According to this embodiment, since the semiconductor chip 20 and substrate 10 are adhered by the adhesive 30, bonding of both can be achieved simply, and moreover the electrical connection between the electrodes 22 and the leads 12 can be achieved. On the base material of the substrate 10, in the region opposing the surface of the semiconductor chip 20, the film 14 is formed with lower adhesion to the adhesive 30 than the base material of the substrate 10. As a result, on the surface of this film 14, holes and voids are less prone to occurrence, and a semiconductor device of high reliability can be manufactured.

Second Embodiment

Figure 3:
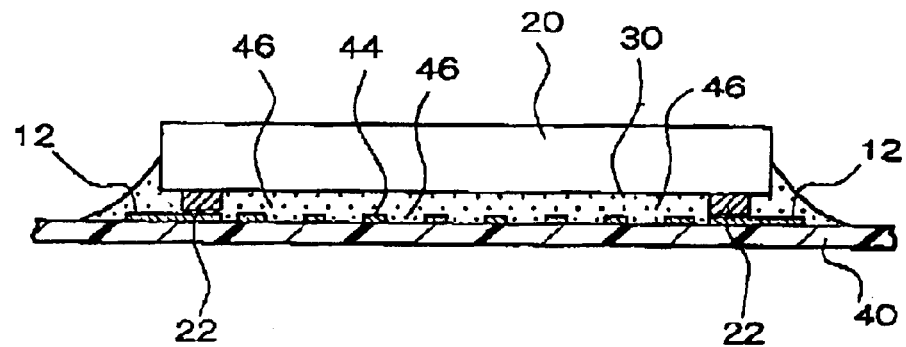
FIG. 3 shows a second embodiment of the semiconductor device according to the present invention.
Figure 4:
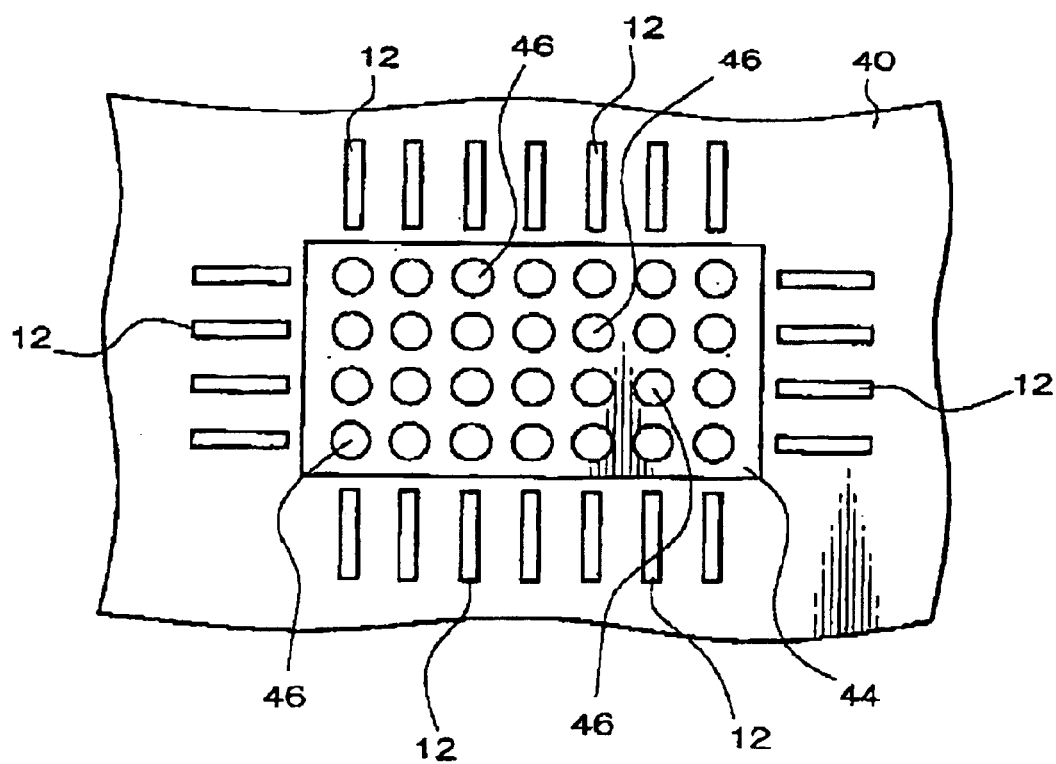
FIG. 4 shows the substrate of the second embodiment of the semiconductor device according to the present invention.

FIG. 3 shows a second embodiment of a semiconductor device to which the present invention is applied, and FIG. 4 shows the substrate used in the semiconductor device shown in FIG. 3. This embodiment of the semiconductor device comprises a substrate 40, and the semiconductor chip 20 and adhesive 30 described in the first embodiment. The substrate 40 has a modified form of the film 14 of the substrate 10 described in the first embodiment, and otherwise the construction is the same as that of the substrate 10, for which reason description is omitted here.

The film 44 of the substrate 40 differs from the film 14 in having formed at least one opening 46. The opening 46 exposes the surface of the base material of the substrate 40, and in form may be circular, rectangular, polygonal, or the like. By forming the opening 46, in at least a part of the film 49 the surface of the base material of the substrate 40 is exposed, and the adhesive 30 enters the opening 46. By doing this, the region in which the adhesive 30 adheres to the substrate 40 is increased, and the adhesion force between the semiconductor chip 20 and the substrate 40 is increased. In particular, rather than forming a single large opening 46, it is preferable to form a plurality of relatively small openings 46 at a plurality of positions in the film 44. By doing this, the occurrence of holes and voids in the film 44 can be prevented, and a loss of adhesion force can be avoided. When forming the opening 46 in the film 44, if the film 44 is formed thinly, for example in the range 8 to 12 μm, it is easy for the adhesive 30 to enter the opening 46, and thus for air to escape, and this is therefore preferable.

For the method of manufacture of this embodiment of the semiconductor device, the method described in the first embodiment can be applied. If a metal foil or conductive foil is etched to form the leads 12 and film 44, the opening 46 can be formed at the same time.

Third Embodiment

Figure 5:
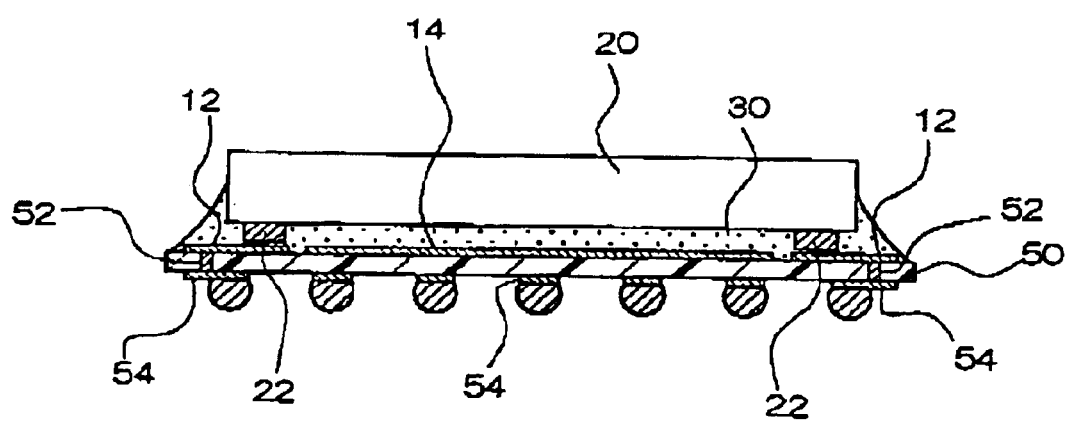
FIG. 5 shows a third embodiment of the semiconductor device according to the present invention.

FIG. 5 shows a third embodiment of the semiconductor device to which the present invention is applied. This embodiment of the semiconductor device comprises a substrate 50, and the semiconductor chip 20 and adhesive 30 described in the first embodiment. The substrate 50 is the substrate 10 described in the first embodiment, in which through holes 52 are formed, and leads 54 are formed on the surface opposite to that of the leads 12, and since otherwise the construction is the same as that of the substrate 10, description is omitted here.

The through holes 52 are formed between some of the plurality of leads 12 formed on one surface of the base material of the substrate 50 and some of the plurality of leads 54 formed on the other surface of the base material of the substrate 50. Each of the through holes 52 is provided with a conductive material by plating of gold or the like or by soldering, so that the leads 12 and 54 on both side of the substrate 50 are electrically connected. On the leads 54 formed on the other surface of the base material of the substrate 50 may be formed external electrodes 56 as solder balls or the like. Equally, without forming solder balls the leads 54 themselves may serve as external terminals. Otherwise for the construction and the method of manufacture may be applied the same construction and method of manufacture as in the first embodiment.

The presence of the film 14 means that the occurrence of warping of the substrate which could occur when the film 14 is not present on a flexible substrate such as for example a polyimide substrate can be limited. When the film 14 is not formed on the base material of the substrate, and particularly when the substrate is such as to have flexibility, then the problem of warping of the substrate itself occurs, but by the provision of the film 14 the excellence of strength can be maintained. In other words, by the adoption of the present construction whereby the generation of bubbles can be restricted, flatness can be adequately ensured on the surface on which the external terminals are formed. Therefore, the reliability in external connection can also be improved.

Fourth Embodiment

Figure 6:
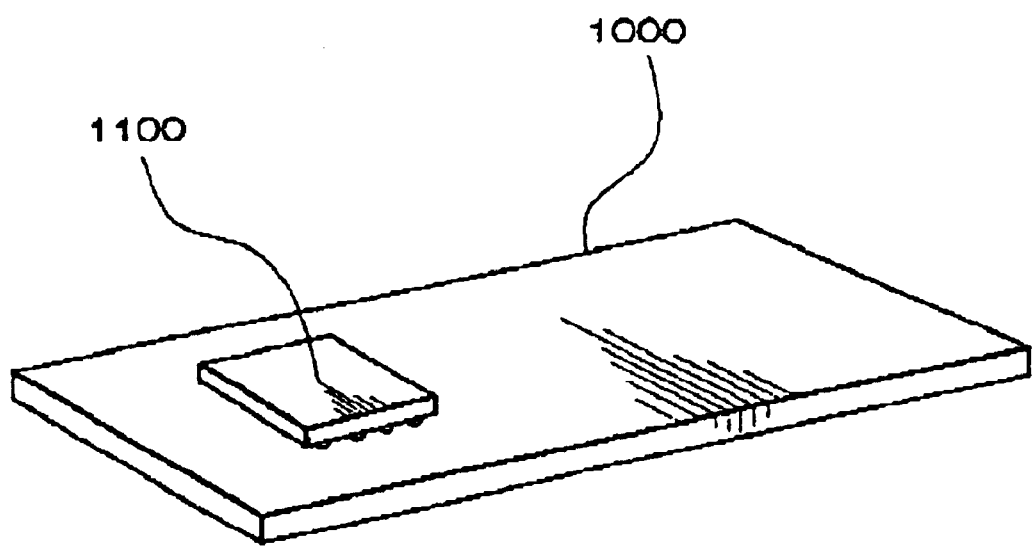
FIG. 6 shows the substrate of the fourth embodiment of the semiconductor device according to the present invention.

FIG. 6 shows a fourth embodiment of the substrate used in the semiconductor device to which the present invention is applied. A substrate 110 has a film 114 having a modified form of the film 14 of the substrate 10 described in the first embodiment.

The substrate 110 has a plurality of leads 112 formed, and the film 114 is formed so as to be interleaved with the leads 112. For example, a pair of leads 112 are aligned parallel, and the film 114 is formed with a projection 116 entering therebetween. On the film 114 are formed a plurality of projections 116. The projections 116 and leads 12 are preferably formed with as large as possible a gap therebetween, and for example preferably there is a gap of approximately 25 μm to 50 μm. Otherwise the construction is the same as in the substrate 10, and description is omitted here. In this embodiment also, the benefit of the first embodiment can be achieved.

Fifth Embodiment

Figure 7:
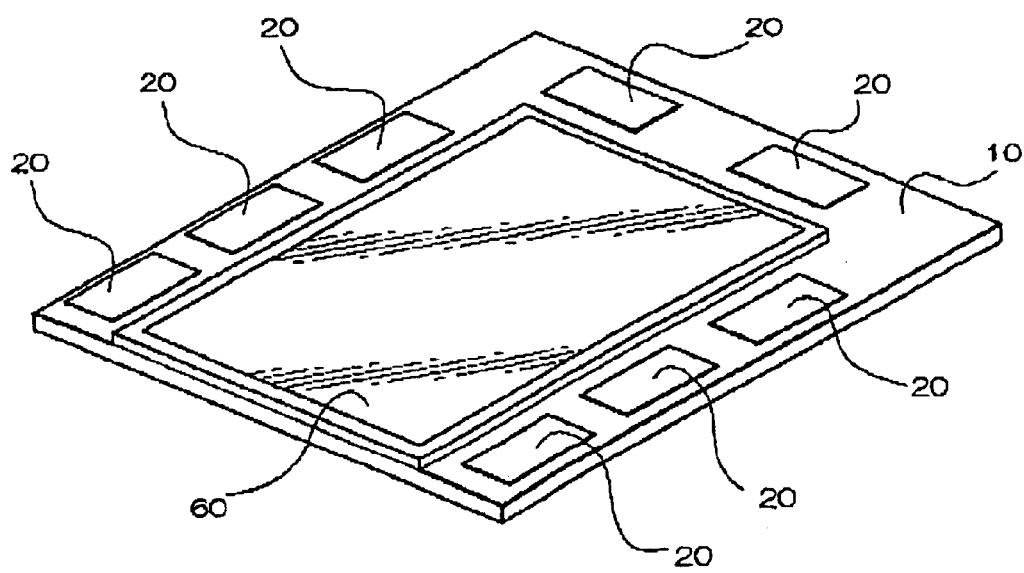
FIG. 7 shows a circuit board on which is mounted a fifth embodiment of the semiconductor device.

FIG. 7 shows a circuit board 1000 on which is mounted a fifth embodiment of the semiconductor device 1100 to which the present invention is applied. For the circuit board an organic substrate such as for example a glass epoxy substrate is commonly used. On the circuit board, is formed an interconnect pattern of for example copper formed into a desired circuit, and by the mechanical connection of this interconnect pattern to the external electrodes of the semiconductor device, the electrical conduction is achieved.

Sixth Embodiment

Figure 8:
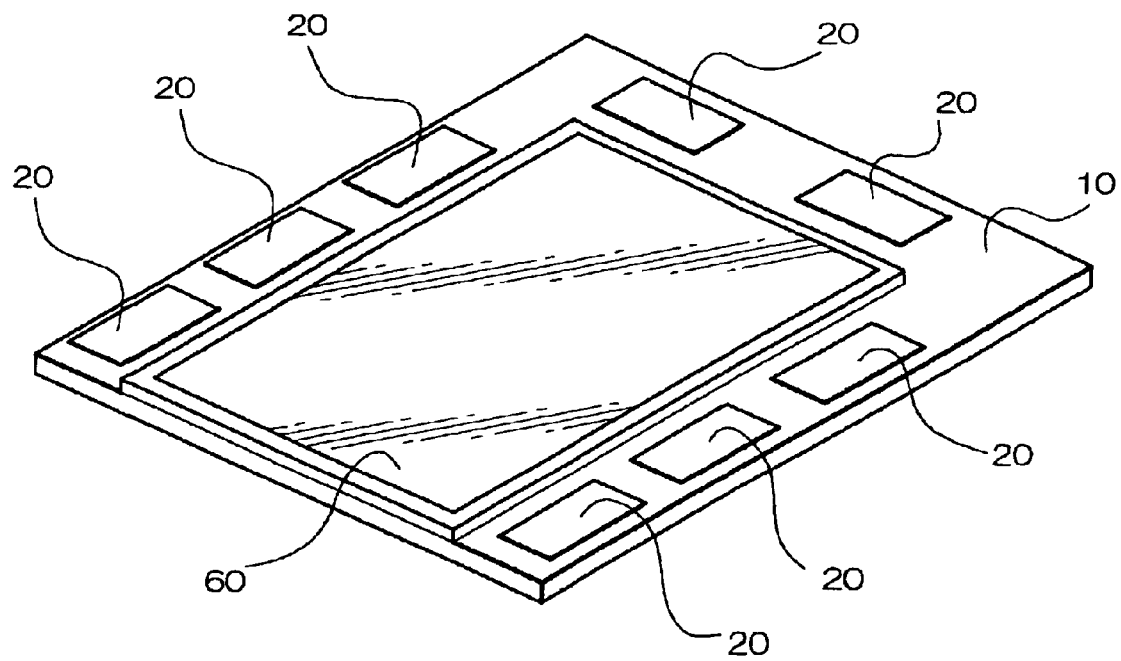
FIG. 8 shows an electronic instrument equipped with a sixth embodiment of the semiconductor device.

As an example of an electronic instrument to which the present invention is applied, FIG. 8 shows the substrate 10 on which the semiconductor chip 20 is mounted, with a liquid crystal panel 60 fitted. The semiconductor chip 20 is the driver for the liquid crystal panel 60.

Seventh Embodiment

Figure 9:
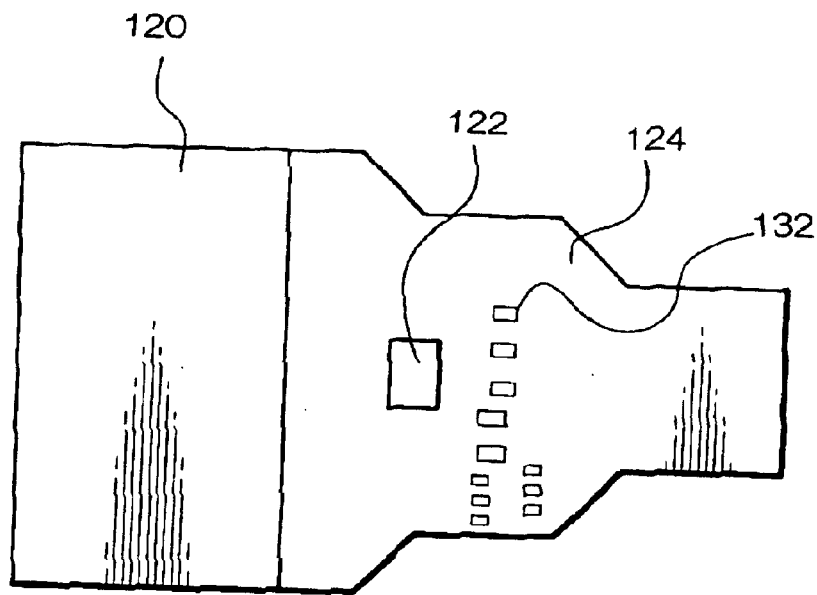
FIG. 9 shows an electronic instrument equipped with a seventh embodiment of the semiconductor device.

FIG. 9 shows a seventh embodiment being an electronic instrument to which the present invention is applied. The electronic instrument shown in FIG. 9 is an LCD module, and includes a liquid crystal panel 120, a semiconductor chip 122, and a substrate 124. The semiconductor chip 122 includes the drive circuit for the liquid crystal panel 120. The present invention is applied to the adhesion construction of the semiconductor chip 122 and the substrate 124. The semiconductor chip 122 is mounted on the substrate 124 to constitute a semiconductor device. For the mounting of the semiconductor chip 122, COF (Chip On Film) is applied. As a result, the substrate 124 is a flexible film of thickness for example approximately 25 µm. Such a substrate 124 has, for example, a plurality of interconnect pattern elements formed by patterning on the film in a matrix form, to which those parts of the interconnect pattern not to be electrically connected have a resist provided, and individual elements of the interconnect pattern are formed by cutting out.

Figure 10:
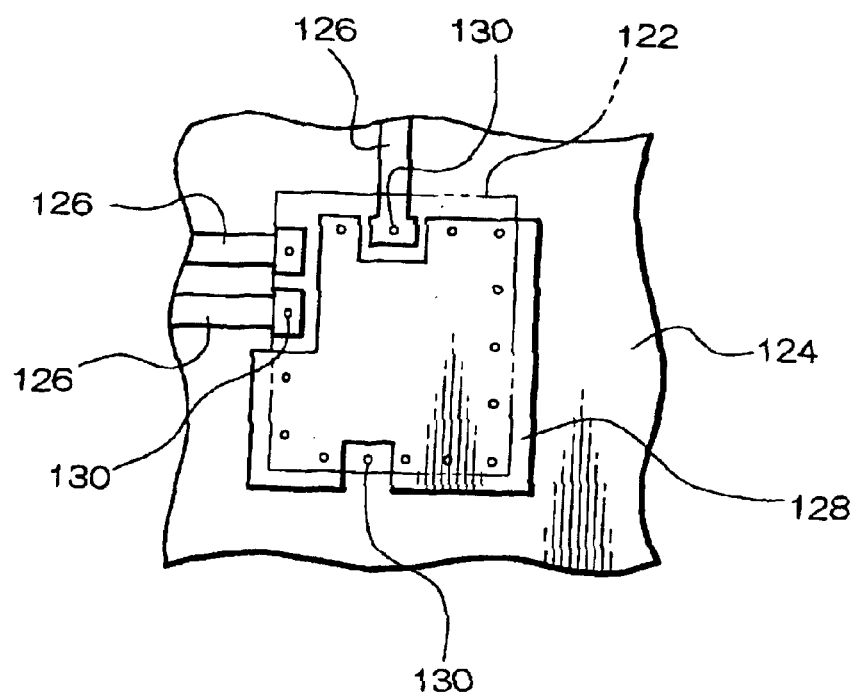
FIG. 10 shows details of the seventh embodiment of the semiconductor device.

FIG. 10 shows details of the semiconductor device in this embodiment. On the substrate 124, a plurality of leads 126 and a film 128 are formed. The leads 126 are electrically connected to the liquid crystal panel 120.

Except for its shape, the description in the first embodiment also applies to the film 128. The film 128 is formed to avoid at least one (one or a plurality) of the leads 126. To the film 128 may be connected at least one (one or a plurality) of the leads 126.

The film 128 comprises a first portion disposed within the region of the surface of formation of electrodes 130 of the semiconductor chip 122, and a second portion projecting outside that region. In the first portion, the electrodes 130 of the semiconductor chip 122 (preferably bumps) may contact the film 128 and be electrically conductive therewith. In this case, the whole of the film 128 may be at ground potential (GND potential).

Alternatively, the first portion may be formed to avoid the electrodes 130. For example, when the first portion has formed concave portions to avoid the electrodes 130, the leads 126 may extend into the concave portions, and within the concave portions the electrodes 130 may be bonded to the leads 126.

Of the film 128, since the second portion projects outside from the surface of formation of the electrodes 130 of the semiconductor chip 122, bubbles generated within the adhesive adhering the semiconductor chip 122 and the substrate 124 tend to be dispersed on the film 128 and released to the exterior.

The electronic instrument shown in FIG. 9 may have at least one electronic component 132 mounted. The method of manufacture of such an electronic instrument comprises a step of mounting the semiconductor chip 122 on the substrate 124, a step of mounting the electronic component 132, and a step of connecting the substrate 124 on which the semiconductor chip 122 is mounted to a liquid crystal display panel 120.

For the mounting of the semiconductor chip 122, face-down bonding using for example an anisotropic conductive material may be applied. For the mounting of the electronic component 132, SMT (Surface Mount Technology) may be applied, carrying out brazing or soldering through a reflow process. To reduce or eliminate contamination of the substrate 124, the brazing step is preferably carried out as late as possible in the process.

In all of the embodiments described above, the region in which the adhesive is disposed includes a region of low adhesion with the adhesive such as, for example the film or interconnect pattern, and a region of high adhesion with the adhesive such as the base material of the substrate. To limit the generation of holes and voids, it is sufficient to ensure that: area of region of low adhesion ≧ area of region of high adhesion.

It should be noted that the above-described "semiconductor chip" of the present invention may be replaced by "electronic element," and an electronic component can be manufactured by mounting an electronic element (whether an active element or a passive element) on the substrate in the same way as a semiconductor chip. As electronic components manufactured using such an electronic element may be cited, for example, optical elements, resistors, capacitors, coils, oscillators, filters, temperature sensors, thermistors, varistors, variable resistors, and fuses.

What is claimed:

1. A method of manufacture of a semiconductor device, comprising the steps of:

providing an adhesive between a surface of a semiconductor chip having a plurality of electrodes on which said electrodes are provided and a surface of a substrate having a plurality of leads and an undivided film on which said leads and said undivided film are formed;

positioning at least one of said plurality of electrodes to be opposed to at least one of said plurality of leads such that said undivided film is opposed to said semiconductor chip; and applying pressure in a direction such as to make a gap between said semiconductor chip and said substrate narrower such that said adhesive extends to be disposed on the whole of said undivided film;

wherein said undivided film is formed with a lower adhesion to said adhesive than a base material of said substrate, and said undivided film is broader than each of said leads at their portions opposed to said electrodes, and said undivided film is formed to be electrically isolated from both said electrodes and said leads, wherein a region on which said adhesive is disposed includes a first region with low adhesion to said adhesive and a second region with high adhesion to said adhesive, an area of said first region ≧ an area of said second region.

2. The method of manufacture of a semiconductor device as defined in claim 1, wherein said adhesive is formed of an anisotropic conductive material having conductive particles dispersed in an insulating material.

3. The method of manufacture of a semiconductor device as defined in claim 1, wherein said leads and said undivided film are formed by etching a conductive foil adhered to said base material of said substrate.

4. The method of manufacture of a semiconductor device as defined in claim 1, wherein a conductive foil used when forming said leads is also used to form said undivided film.

5. The method of manufacture of a semiconductor device as defined in claim 4, wherein said undivided film is formed simultaneously with said leads.

6. The method of manufacture of a semiconductor device as defined in claim 1, wherein said electrodes are provided on an extremity of said surface of said semiconductor chip; and wherein said undivided film is formed in a region opposing a central part of said surface of said semiconductor chip.

7. The method of manufacture of a semiconductor device as defined in claim 1, wherein said undivided film is formed to spread two-dimensionally, with at least one opening exposing a surface of said substrate.

8. The method of manufacture of a semiconductor device as defined in claim 1, wherein said undivided film is formed to project outside a region in which said semiconductor chip is adhered.

9. The method of manufacture of a semiconductor device as defined in claim 1, wherein said undivided film is formed to be symmetrical about a center point of a region in which said semiconductor chip is adhered.

10. The method of manufacture of a semiconductor device as defined in claim 1, wherein said undivided film is formed to avoid at least one of said leads.

11. A semiconductor device comprising:

a semiconductor chip having a plurality of electrodes;

a substrate on which is formed a plurality of leads and an undivided film, said undivided film opposed to said semiconductor chip and electrically isolated from both said electrodes and said leads; and an adhesive provided between a surface of said semiconductor chip on which said electrodes are formed and a surface of said substrate on which said leads and said undivided film are formed to adhere said semiconductor chip and said substrate, said adhesive disposed on the whole of said undivided film, wherein at least one of said plurality of electrodes and at least one of said plurality of leads are electrically connected; and wherein said undivided film is formed with a lower adhesion to said adhesive than a base material of said substrate, and said undivided film is broader than each of said leads at their portions opposed to said electrodes, wherein a region on which said adhesive is disposed includes a first region with low adhesion to said adhesive and a second region with high adhesion to said adhesive, an area of said first region $\geq$ an area of said second region.

12. The semiconductor device as defined in claim 11, wherein said adhesive is formed of an anisotropic conductive material having conductive particles dispersed in an insulating material.

13. The semiconductor device as defined in claim 11, wherein said leads and said undivided film are formed of the same electrically conductive material.

14. The semiconductor device as defined in claim 11, wherein said electrodes are provided at an extremity of said surface of said semiconductor chip; and wherein said undivided film is formed in a region opposing a central part of said surface of said semiconductor chip.

15. The semiconductor device as defined in claim 11, wherein said undivided film is formed to spread two-dimensionally, with at least one opening exposing a surface of said substrate.

16. The semiconductor device as defined in claim 11, wherein said undivided film is formed to project outside a region in which said semiconductor chip is adhered.

17. The semiconductor device as defined in claim 11, wherein said undivided film is formed to be symmetrical about a center point of a region in which said semiconductor chip is adhered.

18. The semiconductor device as defined in claim 11, wherein said undivided film is formed to avoid at least one of said leads.

19. A circuit board on which is mounted the semiconductor device as defined in claim 11.

20. An electronic instrument having the semiconductor device as defined in claim 11.

* * * * *